US005485396A

United States Patent [19]
Brasen et al.

[11] Patent Number: 5,485,396
[45] Date of Patent: Jan. 16, 1996

[54] SYMBOLIC ROUTING GUIDANCE FOR WIRE NETWORKS IN VLSI CIRCUITS

[75] Inventors: Daniel R. Brasen, San Francisco; Sunil V. Ashtaputre, San Jose, both of Calif.

[73] Assignee: VLSI Technology, Inc., San Jose, Calif.

[21] Appl. No.: 723,109

[22] Filed: Jun. 28, 1991

[51] Int. Cl.⁶ ............................................... G06F 17/50
[52] U.S. Cl. ........................................... 364/491; 364/490
[58] Field of Search ................................... 364/488, 489, 364/490, 491

[56] References Cited

U.S. PATENT DOCUMENTS

| | | | |
|---|---|---|---|
| 4,580,228 | 4/1986 | Noto | 364/491 |
| 4,630,219 | 12/1986 | DiGiacomo et al. | 364/488 |
| 4,918,614 | 4/1990 | Modarres et al. | 364/490 |
| 4,964,057 | 10/1990 | Yabe | 364/491 |
| 5,065,355 | 11/1991 | Hayase | 364/491 |
| 5,144,563 | 9/1992 | Date et al. | 364/491 |
| 5,187,668 | 2/1993 | Okuda et al. | 364/491 |
| 5,187,864 | 2/1993 | Brasen et al. | 364/491 |
| 5,191,542 | 3/1993 | Murofushi | 364/491 |
| 5,208,759 | 5/1993 | Wong | 364/491 |
| 5,359,538 | 10/1994 | Hui et al. | 364/491 |

OTHER PUBLICATIONS

B. W. Kernighan and S. Lin; *An Efficient Heuristic Procedure for Partitioning Graphs*, Bell System Technical Journal; 49(2):291–307; Feb. 1970.
H. Cho, G. Hachtel, M. Nach, and L. Setiono; *Beat NP: A tool for Partitioning Boolean Networks;* Proceedings of the ICCAD, pp. 10–13; Nov. 1988.
Andrew S. Moulton, *Laying the Power and Ground Wires on a VLSI Chip*, 20th Design Automation conference, IEEE, 1983, pp. 754–755.
David W. Russell, *Hierarchical Routing of Single Layer Metal Trees in Compiled VLSI, ICCAD, IEEE, 1985*, pp. 270–272.
"A New Area–Efficient Power Routing Algorithm for VLSI Layout" by Haryama et al., IEEE 1987, pp. 38–41.
"The Scan Line Approach To Power and Ground Routing" by Xiong et al., IEEE 1986, pp. 6–9.
"Single Layer Routing of Power and Ground Networks in Integrated Circuits" by Syed et al., Journal of Digital Systems, vol. VI, No. 1, pp. 53–63, 1987.
"Computation of Power Supply Nets in VLSI Layout" by Rothermel et al., IEEE 18th Design Automation Conference, 1981, pp. 37–42.
"A Block Interconnection Algorithm for Hierarchical Layout System" by Fukui et al., IEEE Trans. on Computer–Aided Design, vol. CAD-6, No. 3, May 1987, pp. 383–390.
"Automatic Placement–A Review of Current Techniques" by Preas et al., IEEE 23rd Design Automation Cont., 1986, pp. 622–629.
"An Antomatic Routing System for General Cell VLSI Circuits" by Dai et al., IEEE 1985 Custom Integrated Circuits Conf., 1985, pp. 68–71.
"Philo–A VLSI Design System" by Donze et al., IEEE 19th Design Automation Conf., 1982, pp. 163–169.

*Primary Examiner*—Vincent N. Trans
*Attorney, Agent, or Firm*—Douglas L. Weller

[57] ABSTRACT

A floor-plan of component blocks of logical circuits, including the symbolic routing of major connection networks, is produced as part of the process for laying out an integrated circuit on a chip. The floor-plan is produced before performing optimized placement and routing of logical circuits within component blocks of the VLSI circuit. First, the logical circuits are apportioned into component blocks. Then, an initial lay out of the component blocks of the VLSI circuit is performed. The major connection networks are routed between the component blocks so that the major connection networks are connected to connection areas within the component blocks. The initial lay out of component blocks is adjusted as necessary in order to take into account the addition of the major connection networks. Once any needed adjustments are made, routing guidance information is generated as part of the floor plan. The routing guidance information indicates locations and sizes of the major connection networks.

13 Claims, 4 Drawing Sheets

5,485,396

SYMBOLIC ROUTING GUIDANCE FOR WIRE NETWORKS IN VLSI CIRCUITS

BACKGROUND

The present invention concerns the use of symbolic routing guidance in VLSI circuit design for special connection networks such as power, clock, and ground connection networks.

Once the logic circuitry for a very large scale integrated (VLSI) circuit has been designed, placement algorithms are used to place the VLSI circuit logic efficiently upon a chip. The integrated circuit is generally divided into component blocks of logic circuits. The logic circuits are often referred to as logic cells. Each of the component blocks occupies a fixed area when placed on the chip. Each component block is connected to other component blocks through wire networks, also called connection networks. These connection networks have a measurable width and take up space on the integrated circuit which is directly proportional to their length.

On the chip, locations are selected in which to place the component blocks so that the area on the integrated circuit is optimally utilized. Optimal placement of component blocks occurs when the dead space, that is area between component blocks which is not utilized by component blocks, is minimized, and when the total area of connection networks within component blocks and between component blocks will be minimized.

Once component blocks are placed on an integrated circuit, the routing of connection networks within the component blocks and between component blocks is performed. These connection networks are used to interconnect logic circuitry within the integrated circuit.

In addition to the routing of connection networks used to interconnect logic circuitry within the integrated circuit, it is also necessary to route special wire networks, for example, connection networks of ground wires, power wires and clock wires. In the prior art, automatic routers used for placement of these special wire networks have produced physical layout of wire networks as they are to be placed on the chip. For descriptions of prior art methods for routing special wire networks, see for example, Andrew S. Moulton, *Laying the Power and Ground Wires on a VLSI Chip*, 20th Design Automation Conference, IEEE, 1983, pp. 754–755. See also, David W. Russell, *Hierarchical Routing of Single Layer Metal Trees in Compiled VLSI*, ICCAD, IEEE, 1985, pp. 270–272.

SUMMARY OF THE INVENTION

In accordance with the preferred embodiment of the present invention, a method is presented for producing a floor-plan of a VLSI circuit. The floor-plan is produced before performing optimized placement and routing of logical circuits within component blocks of the VLSI circuit. First, the logical circuits are apportioned into component blocks. Then, an initial lay out of the component blocks of the VLSI circuit is performed. The major connection networks are routed between the component blocks so that the major connection networks are connected to connection areas within the component blocks. This is done by first performing a non-optimized placement and routing of logical circuits within the component blocks which identifies connection areas for the major connection networks. Then, a non-optimized global route of major connection networks is performed between the connection areas of the component blocks.

The initial lay out of component blocks is adjusted as necessary in order to take into account the addition of the major connection networks. Once any needed adjustments are made, routing guidance information is generated as part of the floor plan. The routing guidance information indicates locations and sizes of the major connection networks. The major connection networks include, for example, a power connection network, aground connection network and/or a clock connection network.

After the floor-plan of component blocks is produced, optimized placement and routing of logical circuits within the component blocks is performed. Finally, optimized global routing of non-major connection networks is performed between connection areas of the component blocks.

The present invention provides for the routing of major connection networks such as clock connection networks, power connection networks and ground connection networks at the floor-plan level. This allows floor-plans to be altered to accommodate these major connection networks early in the design process, before the optimized placement and routing of logical circuits within component blocks. This results in much more accurate placement of component blocks and major connection networks at a floor-plan level, before the actual optimized placement and routing of all the logic circuitry within the component blocks.

DESCRIPTION OF THE PREFERRED EMBODIMENT

Figure 1:
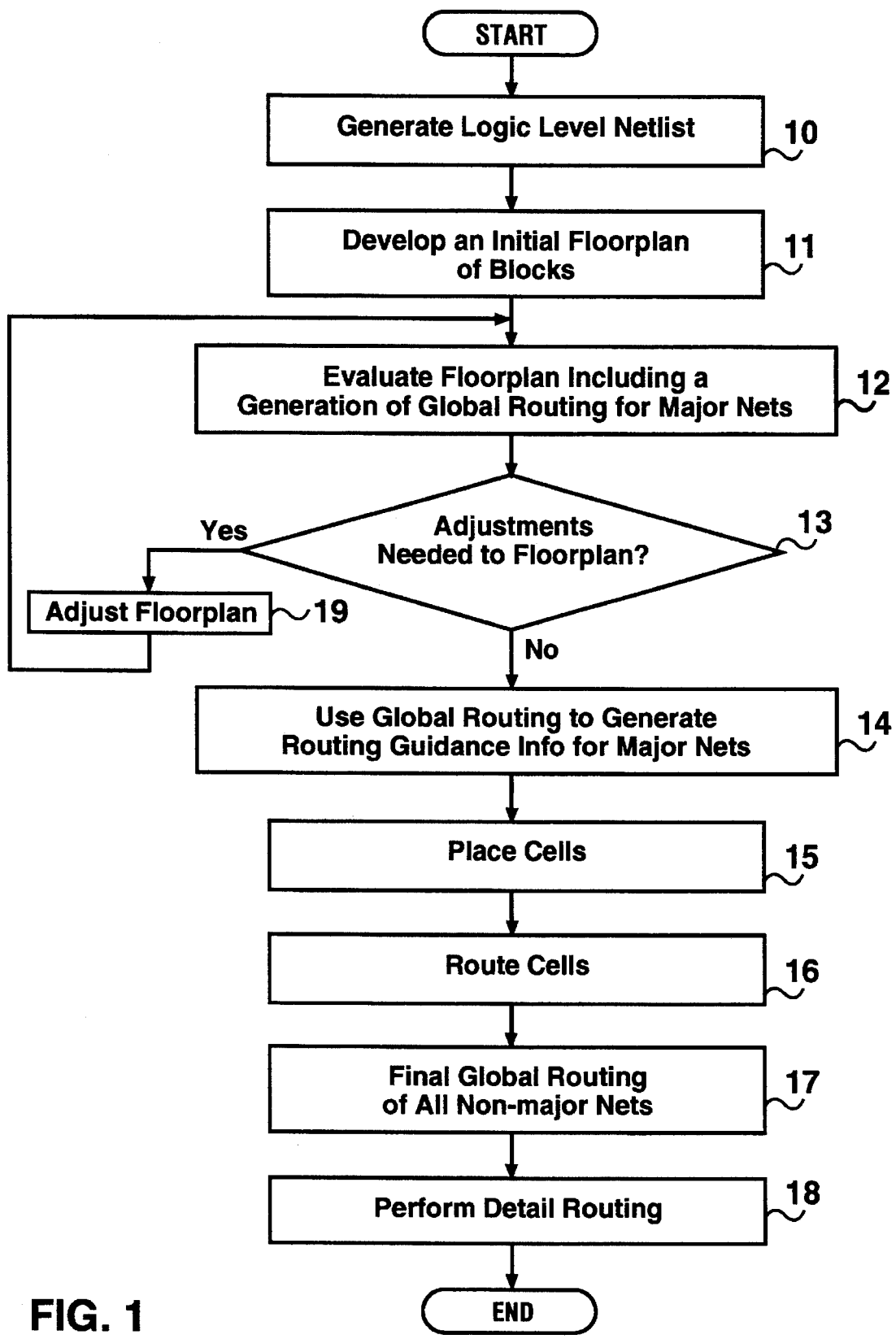
FIG. 1 shows a flowchart of a method for hierarchical design of a VLSI circuit in accordance with the preferred embodiment of the present invention.

FIG. 1 is a flowchart for the hierarchical design of a VLSI circuit and lay out of the VLSI circuit on a chip. In a step 10, a logic level netlist is generated. For further information on the generation of logic level netlists, see for example, Stephen M. Trimberger, *An Introduction to CAD for VLSI*, Kluwer Academic Publishers, Boston, 1987, pp. 7, 136.

In a step 11, the logic circuitry to be placed is apportioned into component blocks of logical components and an initial floor-plan is developed. During the floor-planning, an estimate is made of the size and shape of each component block. The size maybe estimated, for example, by using formulae which generate an estimated size of a component block based on the number of logical components within the component block.

There is no need to make an estimate of the size and shape of component blocks which are megacells such as RAM blocks or data-path blocks, nor is there need to make an estimate of the size and shape of component blocks which are hierarchical component blocks, that is, which are collections of standard logic cell blocks and megacells. This is because megacells and hierarchical component blocks generally have fixed sizes and pin locations. Nevertheless, it is necessary to estimate the size and shape of hierarchical component blocks when the hierarchical component block is first generated.

For further information on the apportioning of circuit logic into component blocks of logical components and estimating the size and shape of component blocks, see for example, B. W. Kernighan and S. Lin; *An Efficient Heuristic Procedure for Partitioning Graphs;* Bell System Technical Journal; 49(2):291–307; February 1970, or see H. Cho, G. Hachtel, M. Nach, and L. Setiono; *BEAT NP: A Tool for Partitioning Boolean Networks;* Proceedings of the ICCAD, pp. 10–13; November 1988.

Figure 2:
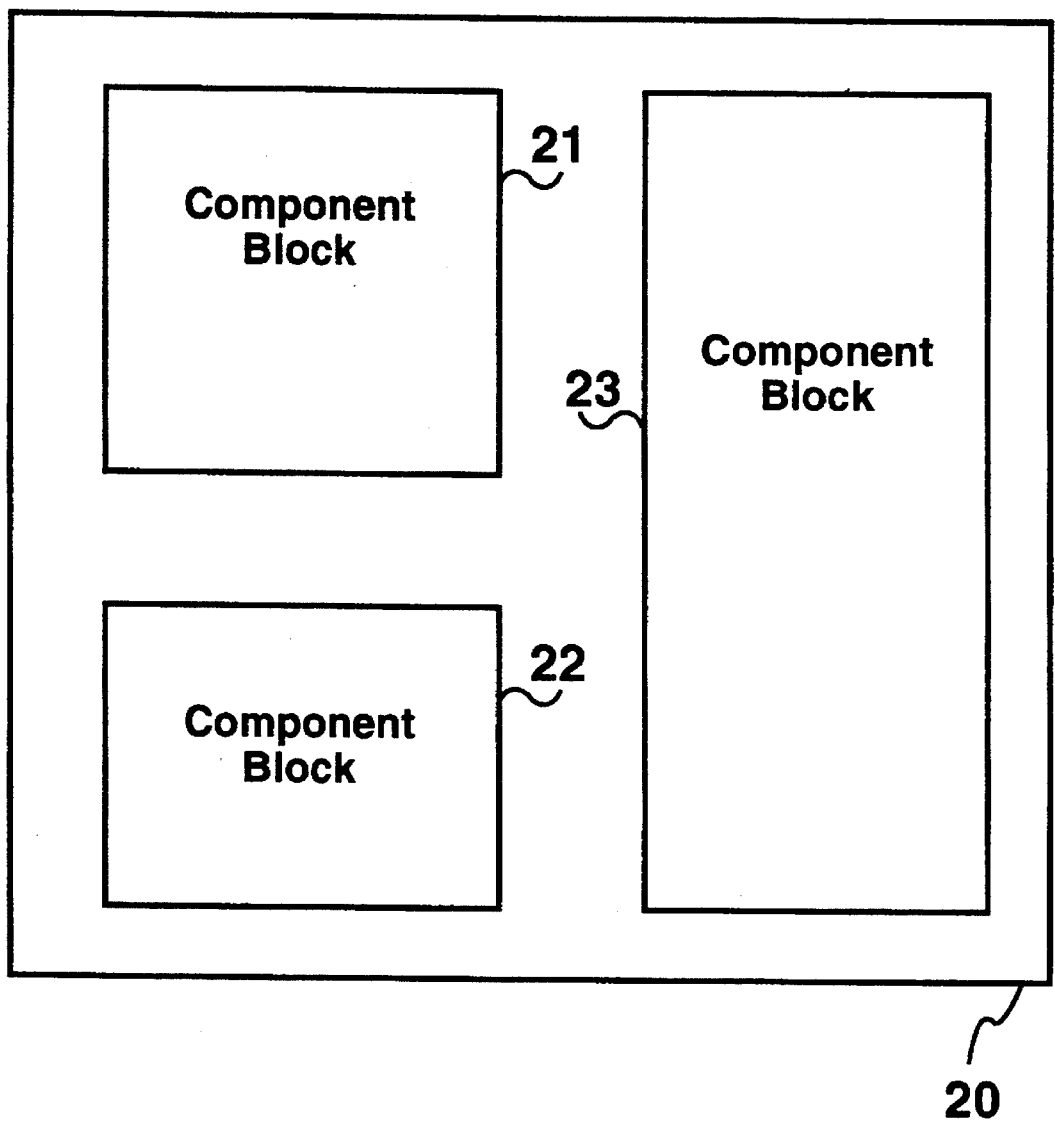
FIG. 2, FIG. 3 and FIG. 4 are block diagrams which illustrate stages of the determination of placement of circuit logic upon a chip in accordance with the preferred embodiment of the present invention.

The result of an initial floor-plan is shown in FIG. 2. A first component block 21, a second component block 22 and a third component block 23 are shown located within a chip 20.

In a step 12, after the initial floor-plan of the component blocks is made, the initial floor-plan is evaluated. During this evaluation additional information about the component blocks is determined and a global route of the major connection networks of the circuit is performed.

The first step of the evaluation includes, for example, a re-estimate of component block size and shape. This is done, for example, by a quick placement and routing of standard logic cell blocks within the component block. A non-optimized placement algorithm such as a minimum cut algorithm may be used for the placement of logical components within the component blocks. Similarly, a non-optimized routing algorithm, such as a Steiner tree algorithm may be used for the routing within each component block. For more information on using placement and routing algorithms for floor-planning, see for example, D. F. Wong and C. L. Liu, *A New Algorithm for Floorplan Design,* 23rd Design Automation Conference, 1986, pp. 101–107. See also, Charles Ng, Sunil Ashtaputre, Elizabeth Chambers, Kieu-huong Do, Siu-tong Hui, Rajiv Mody, and Dale Wong, *A Hierarchical Floor-Planning, Placement, and Routing Tool for Sea-of-Gates Designs,* custom Integrated Circuits Conference, IEEE 1989, pp. 3.3.1–3.3.4.

Figure 3:
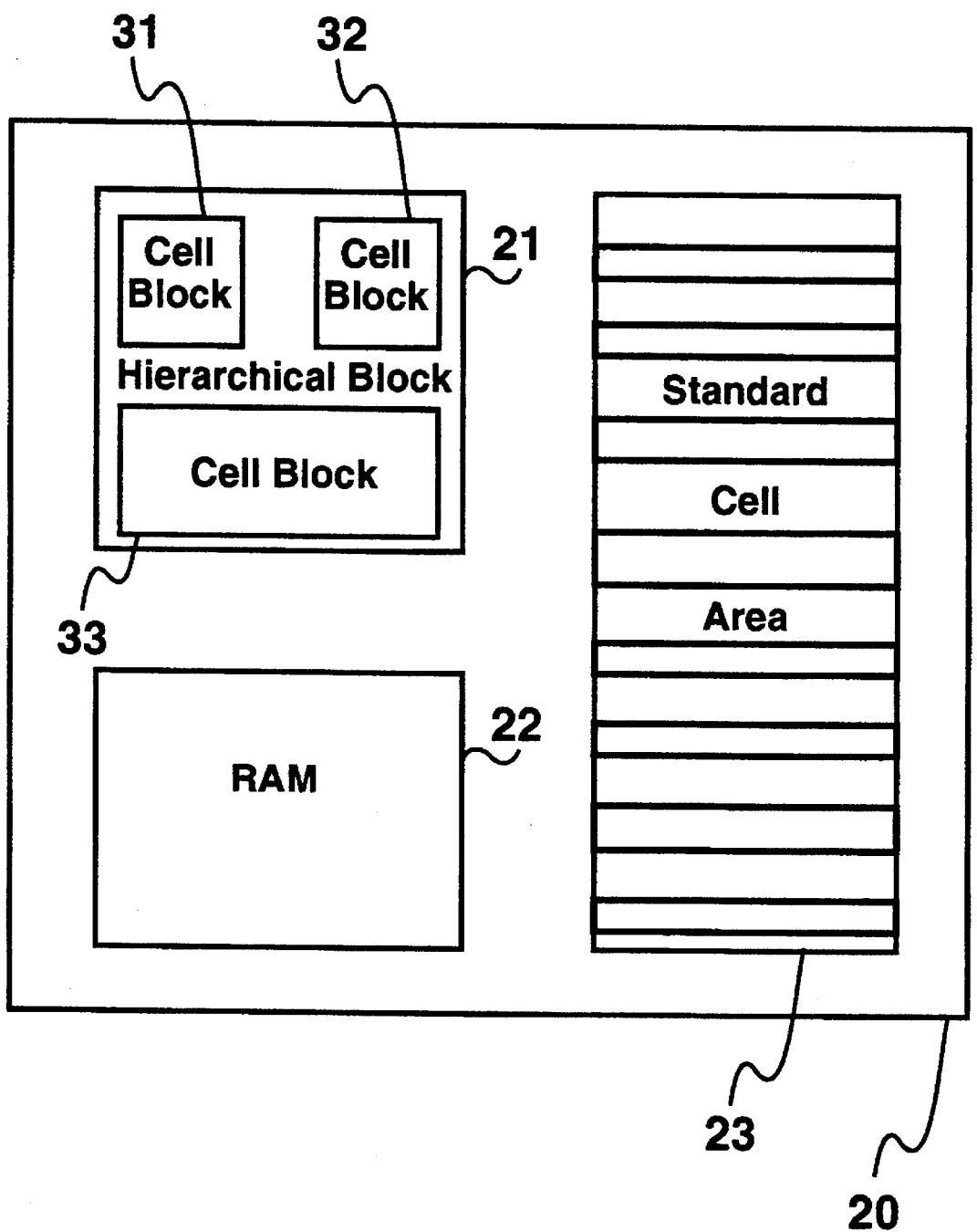

A result of the non-optimized placement and routing of standard logical components within component blocks is shown in FIG. 3. There, component block 21 is shown to be a hierarchical component block which has a first logic cell block 31, a second logic cell block 32 and a third logic cell block 33. Component block 22 is RAM. Component block 23 is composed of standard logic cells. The non-optimized placement and routing of the standard logic cells yields additional information about the component blocks that is used to locate connector areas of the major connection networks to the component blocks and to determine the approximate current which need to be supplied at the connector areas. Major connection networks are, for example, connection networks which are used for supplying power, for supplying ground and for supplying a clock signal.

Once the component block size and shape have been re-estimated, a non-optimized global route between the component blocks may be performed. The global routing connects the major connection networks to the appropriate connector areas. This global routing is performed with a non-optimized routing algorithm such as a Steiner Tree algorithm. When the non-optimized global routing is performed, the locations of input/output pads for the chip may be determined.

Figure 4:
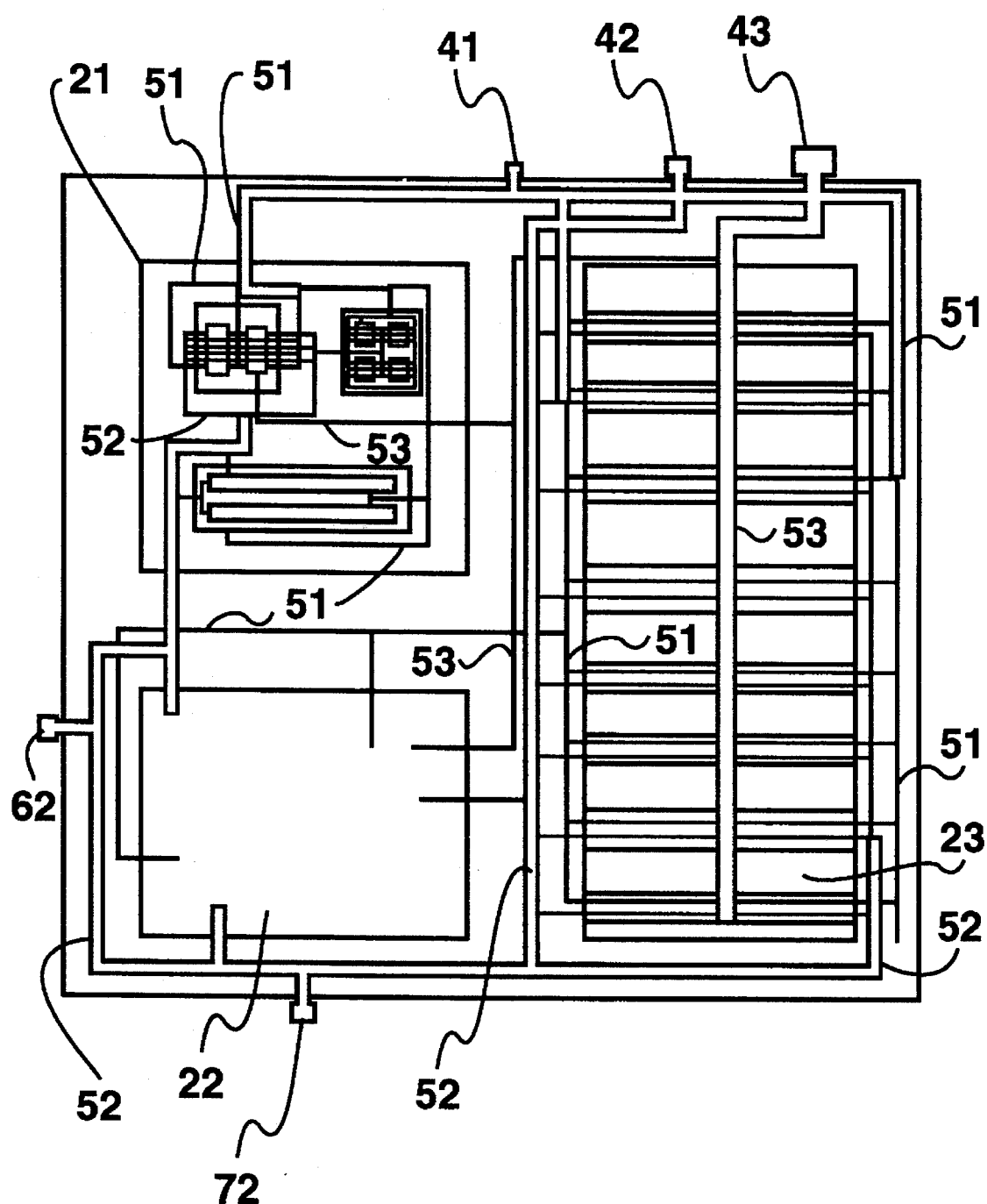

For example, FIG. 4 shows the result of a global routing of the major connection networks. A power connection network 51 is shown connected to an input/output pad 41 and various connector locations within component block 21, component block 22 and component block 23. A ground connection network 52 is shown connected to an input/output pad 42, and input/output pad 62, an input/output pad 72 and various connector locations within component block 21, component block 22 and component block 23. A clock connection network 53 is shown connected to an input/output pad 43 and various connector locations within component block 21, component block 22 and component block 23.

In a step 13, after the global routing of the major connection networks is complete, the floor-plan is evaluated to see if the routing of the major connection networks will make the initial floor-plan unworkable. This can happen, for example, when the space between component blocks is not sufficiently large to accommodate one or more major connection networks routed between them. If necessary, the floor-plan is adjusted in a step 19. The adjusted floor-plan is then re-evaluated in step 12.

In a step 14, when no further adjustments are needed to the floor-plan, the non-optimized global routing between the component blocks is used to generate routing guidance information for the major connection networks. This routing guidance information is essentially a reservation of area on the circuit for placement of the major connection networks. The width of a connection network at a particular location is calculated based on the current required to flow through the connection network at that location. Because the routing guidance information is a reservation of area on the circuit for placement of the major connection networks, the routing guidance may be readily evaluated and modified by a designer at the floor-plan level, before the final layout information is generated.

In a step 15, the logical components within the logical component blocks are placed using an optimized placement algorithm. in a step 16, the connection networks are routed between the logical components within the component blocks using an optimized routing algorithm. In a step 17, global routing of the non-major connection networks is performed. During the global routing of the non-major connection networks, any needed adjustments to the original routing of the major connection networks is made. In a step 18 detailed routing between the component blocks and the connection networks is performed.

For more information on the placement and routing of logical components, see for example, Charles Ng, Sunil Ashtaputre, Elizabeth Chambers, Kieu-huong Do, Siu-tong Hui, Rajiv Mody, and Dale Wong; *A Hierarchical Floor-Planning, Placement, and Routing Tool for Sea-of-Gates Designs,* IEEE 1989 Custom Integrated Circuits Conference, pp. 3.3.1–3.3.4; and see David Hsu, Leslie Grate, Charles Ng, Mark Hartoog and Denis Bohm, *The ChipCompiler, An Automated Standard Cell/Macrocell Physical Design Tool,* IEEE 1987 Custom Integrated Circuits Conference, p 488–491. See also, Carl Sechen, *Chip-Planning, Placement, and Global Routing of Macro/Custom Cell Integrated Circuits Using Simulated Annealing,* 25th ACM/IEEE Design Automation Conference, 1988, pp. 73–80, for further information on optimized algorithms for logic cell placement, intra-block routing and global routing.

A primary advantage of the present invention is the generation of routing guidance information for major connection networks at the floor-plan level. In prior art systems such as those discussed, for example, by Carl Sechen in *Chip-Planning, Placement, and Global Routing of Macro/Custom Cell Integrated Circuits Using Simulated Annealing,* 25th ACM/IEEE Design Automation Conference, 1988, pp. 73–80, it is not until after optimized placement and optimized routing of logical circuits within each block has been completed that the floor-plan is evaluated to determine whether the global routing of major connection networks requires adjustments to the floor-plan. In the present invention, the global routing of major connection networks is performed before the optimized placement and optimized routing of logical circuits within each component block has been performed. The global routing guidance information generated from the global routing of major connection networks designates the routing locations of the major connection networks and thus allows adjustments to be made to the floor-plan at the floor-plan level in order to accommodate the location and size of the major connection networks.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for laying out logical circuits on a chip, the method comprising the steps of:
   (a) laying out an initial floor-plan of component blocks of the logical circuits;
   (b) routing a first set of connection networks between connection areas of the component blocks;
   (c) from the routing performed in step (b), generating routing guidance information which indicates location and size of the first set of connection networks;
   (d) after step (c) performing optimized placement and routing of logical circuits within the component blocks; and,
   (e) after step (c) routing a second set of connection networks between the component blocks.

2. A method as in claim 1 wherein step (b) includes making any needed adjustments to the locations of component blocks as laid out in step (a) in order to take into account the locations of the first set of connection networks as laid out in step (b).

3. A method as in claim 2 wherein the first set of connection networks include a power connection network and a ground connection network.

4. A method as in claim 3 wherein the first set of connection networks additionally include a clock connection network.

5. A method as in claim 1 wherein the first set of connection networks include a power connection network and a ground connection network.

6. A method as in claim 5 wherein the first set of connection networks additionally include a clock connection network.

7. A method as in claim 1 wherein step (b) contains the substeps of:
   (b.1) performing a non-optimized placement and routing of logical circuits within the component blocks which identifies connection areas for the first set of connection networks; and,
   (b.2) performing a non-optimized global route of the first set of connection networks between the connection areas of the component blocks.

8. A method as in claim 1 wherein step (b) includes determining placement of I/O pads on the chip.

9. A method for producing a floor-plan of a VLSI circuit, the floor-plan being produced before performing optimized placement and routing of logical circuits within component blocks of the VLSI circuit, and the method comprising the steps of:
   (a) apportioning the logical circuits into component blocks;
   (b) performing an initial lay out of the component blocks of the VLSI circuit, the initial lay out including connection areas where a first set of connection networks are connected to the component blocks;
   (b) routing the first set of connection networks between the connection areas of the component blocks;
   (c) making any needed adjustments to the locations of component blocks as laid out in step (a) in order to take into account the locations of the first set of connection networks as laid out in step (b); and,
   (d) from the routing performed in step (b), generating routing guidance information which indicates location and size of the first set of connection networks.

10. A method as in claim 9 wherein the first set of connection networks include a power connection network and a ground connection network.

11. A method as in claim 10 wherein the first set of connection networks additionally include a clock connection network.

12. A method as in claim 11 wherein step (b) contains the substeps of:
   (b.1) performing a non-optimized placement and routing of logical circuits within the component blocks; and,
   (b.2) performing a non-optimized global route of the first set of connection networks between the component blocks.

13. A method as in claim 9 wherein step (b) includes determining placement of I/O pads on the chip.

* * * * *